(12) United States Patent
Nakayama et al.

(10) Patent No.: US 11,525,794 B2
(45) Date of Patent: Dec. 13, 2022

(54) UNIFORMITY PROPERTY ACQUISITION APPARATUS, METHOD OF ACQUIRING UNIFORMITY PROPERTY AND NON-TRANSITORY COMPUTER-READABLE RECORDING MEDIUM

(71) Applicant: HIOKI E.E. CORPORATION, Ueda (JP)

(72) Inventors: Naoto Nakayama, Ueda (JP); Akihiro Shioiri, Ueda (JP); Yuki Kawamuro, Ueda (JP)

(73) Assignee: HIOKI E.E. Corporation, Ueda (JP)

( * ) Notice: Subject to any disclaimer, the term of this patent is extended or adjusted under 35 U.S.C. 154(b) by 87 days.

(21) Appl. No.: 17/155,815

(22) Filed: Jan. 22, 2021

(65) Prior Publication Data

US 2021/0231594 A1 Jul. 29, 2021

(30) Foreign Application Priority Data

Jan. 23, 2020 (JP) .............................. JP2020-009423
Jan. 23, 2020 (JP) .............................. JP2020-009424

(51) Int. Cl.
*G01N 27/02* (2006.01)
*G01N 27/12* (2006.01)
*G01R 27/08* (2006.01)

(52) U.S. Cl.
CPC ......... *G01N 27/028* (2013.01); *G01N 27/122* (2013.01); *G01R 27/08* (2013.01)

(58) Field of Classification Search
CPC ...... G01N 27/00; G01N 27/02; G01N 27/028; G01N 27/04; G01N 27/06; G01N 27/07; G01N 27/08; G01N 27/12; G01N 27/122; G01N 15/00; G01N 15/0042;
(Continued)

(56) References Cited

U.S. PATENT DOCUMENTS

2006/0265150 A1 11/2006 Hu et al.
2017/0071500 A1* 3/2017 Von Maydell ....... A61B 5/7246

FOREIGN PATENT DOCUMENTS

CN 109752416 A 5/2019
JP 2013167485 A 8/2013
(Continued)

OTHER PUBLICATIONS

Extended European Search Report for European Application No. 21153049.8, dated Jun. 1, 2021, 8 pages.
(Continued)

*Primary Examiner* — Hoai-An D. Nguyen
(74) *Attorney, Agent, or Firm* — Jordan IP Law, LLC

(57) ABSTRACT

A uniformity property acquisition apparatus is the uniformity property acquisition apparatus configured to acquires a uniformity property of a mixture in which an insoluble solid matter is mixed in liquid, and the uniformity property acquisition apparatus includes: a pair of electrodes configured to apply the AC signal to the mixture; measurement unit configured to measure impedance of the mixture on the basis of a response signal flowing through the mixture when the AC signal is applied to the mixture; and processing unit configured to acquire the uniformity property of the mixture on the basis of the impedance measured by the measurement unit.

11 Claims, 8 Drawing Sheets

(58) Field of Classification Search
CPC ............... G01N 15/0053; G01N 15/02; G01N 15/0277; G01R 27/00; G01R 27/02; G01R 27/08
USPC ......................... 324/600, 649, 691, 430, 525
See application file for complete search history.

(56) References Cited

FOREIGN PATENT DOCUMENTS

| | | | |
|---|---|---|---|
| JP | 2015222651 A | 12/2015 | |
| JP | 2016125811 A | 7/2016 | |

OTHER PUBLICATIONS

"Determination of particle size distribution by gravitational liquid sedimentation methods—Part 1: General principles and guidelines," Japanese Industrial Standards No. JIS Z8820-1:2002, Jul. 20, 2002, 16 pages including English explanation, Japanese Standards Association, Japan.

"Determination of particle size distribution by centrifugal liquid sedimentation methods—Part 1: General principles and guidelines," Japanese Industrial Standards No. JIS Z8823-1:2001, Apr. 20, 2001, 12 pages including English explanation, Japanese Standards Association, Japan.

\* cited by examiner

UNIFORMITY PROPERTY ACQUISITION APPARATUS, METHOD OF ACQUIRING UNIFORMITY PROPERTY AND NON-TRANSITORY COMPUTER-READABLE RECORDING MEDIUM

CROSS-REFERENCE TO RELATED APPLICATION

The present application claims priority 35 U.S.C. § 119 to on Japanese Patent Application 2020-009423 (filed on Jan. 23, 2020) and Japanese Patent Application 2020-009424 (filed on Jan. 23, 2020), which are hereby incorporated by reference in its entirety.

TECHNICAL FIELD

The present invention relates to a uniformity property acquisition apparatus for acquiring uniformity property of a mixture in which particles of an insoluble solid matter are mixed in liquid, a method of acquiring uniformity property, and a non-transitory computer-readable recording medium including a program for causing a computer to execute the acquisition of the uniformity property of the mixture.

BACKGROUND ART

A particle diameter distribution, etc. is used as an evaluation index of a slurry that is a type of mixture in which particles of an insoluble solid matter are mixed in liquid.

A method for measuring the particle diameter distribution of the particles contained in the slurry includes a sedimentation method. Furthermore, the sedimentation method includes a gravitational liquid sedimentation method (Japan Industrial Standard "JIS Z8820-1:2002") that utilizes the natural gravity and a centrifugal liquid sedimentation method (Japan Industrial Standard "JIS Z8823-1:2001") that utilizes the centrifugal force.

In a sedimentation test based on the above-described sedimentation method, the particle diameter distribution of the particles contained in the slurry can be measured by performing an observation of a change in a height of a boundary between a supernatant liquid layer and a particle layer, which is formed by sedimentation over an elapsed time, an observation of a clarity/turbidity state of the supernatant liquid layer, and so forth by a measurer after the slurry is charged into a sedimentation tube.

SUMMARY OF INVENTION

In recent years, there are increasing demands for higher-functionality and higher-performance in electronic components, etc. Accordingly, there is a demand for a strict management of a quality of the slurry that is a starting material of the electronic components. Accordingly, in addition, it is necessary to clearly grasp a state of the slurry by using evaluation indices such as the uniformity property, etc. representing the type, the particle diameter distribution, and so forth of the particles contained in the slurry.

However, with the above-described sedimentation test, it takes long time until the sedimentation of the particles in the slurry is stabilized. With the centrifugal liquid sedimentation method, although the time required for the test can be reduced compared with the gravitational liquid sedimentation method, it is not practical to perform the centrifugal liquid sedimentation method during the course of a manufacturing process, and reduction in time is required. In addition, the above-described sedimentation test lacks strictness because subjectivity of the measurer is involved in the measurement steps.

As described above, with the above-described test method, there has been a possibility for an improvement in terms of the measurement time and objectivity.

The present invention has been conceived in light of the above-described problem, and an object thereof is to acquire a uniformity property of a mixture within a short period of time.

A uniformity property acquisition apparatus as an aspect of the present invention is the uniformity property acquisition apparatus configured to acquire a uniformity property of a mixture in which an insoluble solid matter is mixed in liquid, the uniformity property acquisition apparatus including: a pair of electrodes configured to apply AC signal to the mixture; measurement unit configured to measure impedance of the mixture on the basis of a response signal flowing through the mixture when the AC signal is applied to the mixture; and processing unit configured to acquire the uniformity property of the mixture on the basis of the impedance measured by the measurement unit.

According to this aspect, because the uniformity property of the mixture in which the insoluble solid matter is mixed in the liquid is acquired on the basis of the impedance of the mixture that is measured on the basis of the response signal flowing through the mixture when the AC signal is applied to the mixture, waiting time is shorter than that in the sedimentation method, and it is possible to acquire the uniformity property without involving the subjectivity of the measurer. Therefore, it is possible to acquire the uniformity property of the mixture in a short period of time.

DESCRIPTION OF EMBODIMENTS

A uniformity property acquisition apparatus according to an embodiment of the present invention is the uniformity property acquisition apparatus that acquires a uniformity property of a mixture in which an insoluble solid matter is mixed in liquid. The uniformity property acquisition apparatus includes: a pair of electrodes configured to apply AC signal to the mixture; measurement unit configured to measure impedance of the mixture on the basis of a response signal flowing through the mixture when the AC signal is applied to the mixture; and processing unit configured to acquire the uniformity property of the mixture on the basis of the impedance measured by the measurement unit.

With the uniformity property acquisition apparatus according to this embodiment, when the AC signal is applied to the mixture in which the insoluble solid matter is mixed in the liquid, the impedance of the mixture is measured on the basis of the response signal flowing through the mixture, and the uniformity property of the mixture is acquired on the basis of this impedance, and therefore, waiting time is shorter than that in a sedimentation method, and it is possible to acquire the uniformity property without involving the subjectivity of the measurer. Therefore, it is possible to acquire the uniformity property of the mixture within a short period of time.

As an example of the uniformity property acquisition apparatus according to this embodiment, a uniformity property measurement apparatus for measuring the uniformity property of the mixture and a uniformity property evaluation apparatus for evaluating the uniformity property of the mixture will be described below.

1. First Embodiment

In a first embodiment, as the uniformity property acquisition apparatus according to an embodiment of the present invention, a uniformity property measurement apparatus 1 for measuring the uniformity property of the mixture will be described. In addition, as an example of a method of acquiring the uniformity property according to the embodiment of the present invention, a uniformity property measurement processing will be described.

[Description of Uniformity Property Measurement Apparatus]

The uniformity property measurement apparatus 1 according to the embodiment of the present invention will be described in detail with reference to FIGS. 1 and 2.

Figure 1:
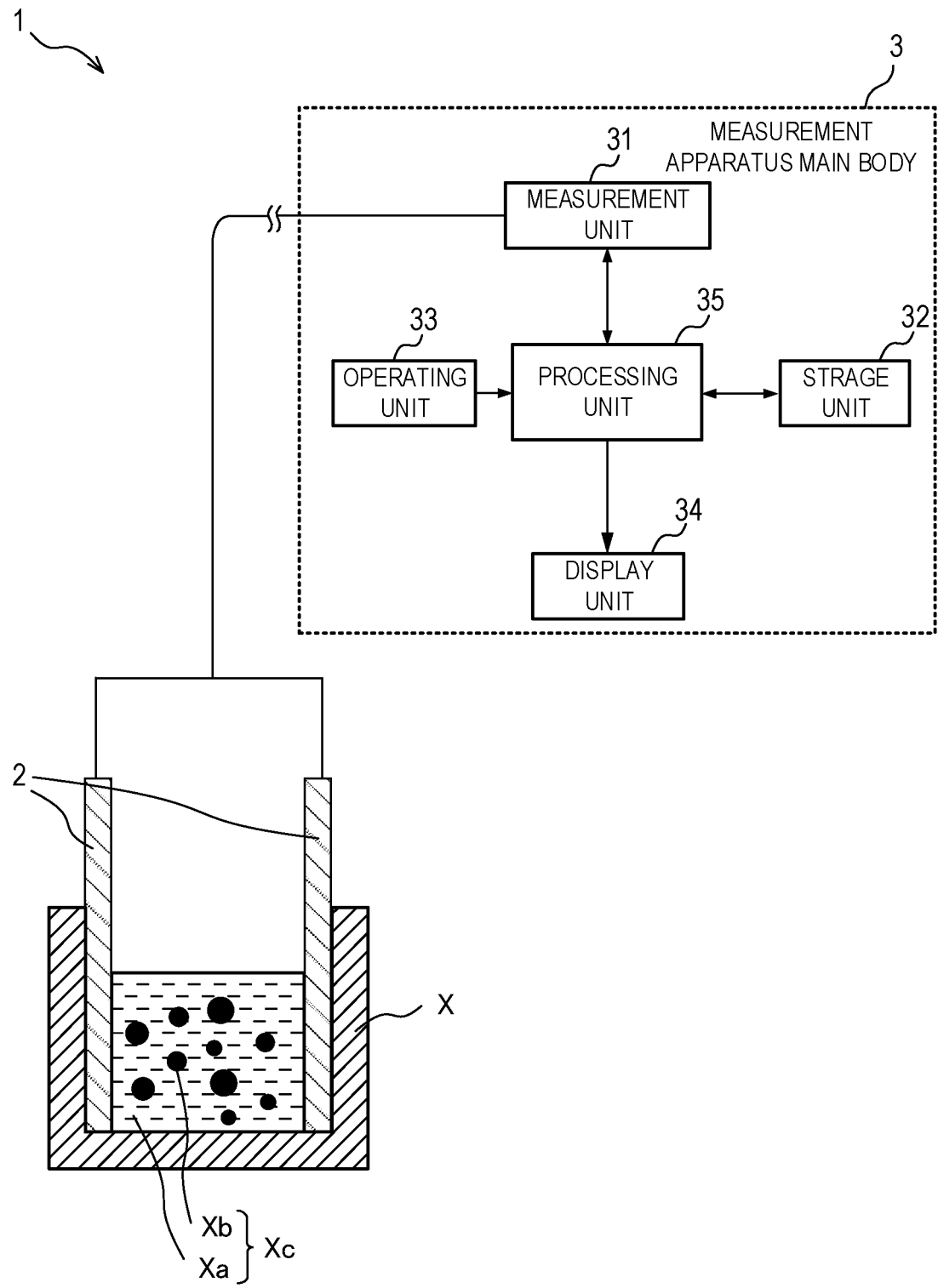
FIG. 1 is a schematic view showing a uniformity property measurement apparatus according to an embodiment of the present invention.
Figure 2:
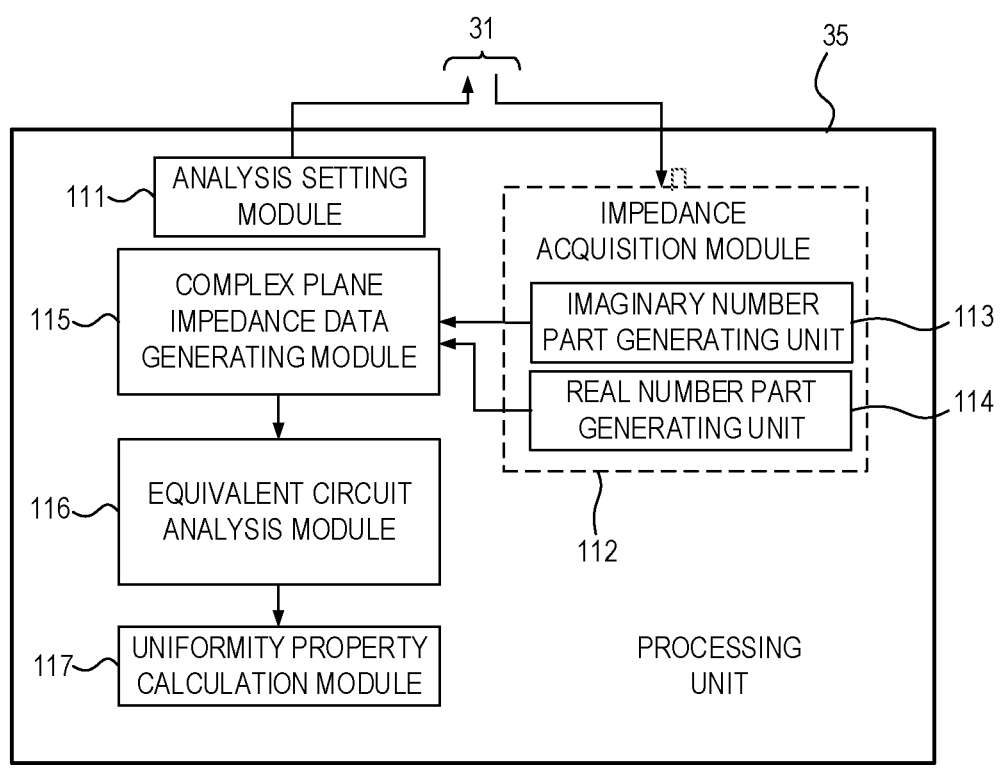
FIG. 2 is a block diagram showing a functional configuration of a processing unit of a measurement apparatus main body.

FIG. 1 is a schematic view showing the uniformity property measurement apparatus 1 according to this embodiment.

The uniformity property measurement apparatus 1 is an apparatus for evaluating a slurry Xc that is a type of mixture that is stored in a tank X and that is formed by mixing an insoluble solid matter (hereinafter referred to as a dispersoid) Xb into liquid Xa. The uniformity property measurement apparatus 1 of this embodiment measures the uniformity property as an evaluation index of the slurry Xc.

In this embodiment, the uniformity property includes the type of the liquid Xa, the type of the dispersoid Xb, the particle diameter of the dispersoid Xb, the particle diameter distribution of the dispersoid Xb, and so forth.

In this embodiment, an example of the slurry Xc includes the mixture in which electrically conductive particles such as carbon black, etc. serving as the dispersoid Xb with high electrical conductivity are dispersed in a solvent (an organic solvent containing a binder resin and an active material) serving as the liquid Xa with low electrical conductivity.

The uniformity property measurement apparatus 1 includes a pair of electrodes 2 and a measurement apparatus main body 3.

The pair of electrodes 2 apply AC voltage serving as the AC signal to the slurry Xc stored in the tank X. The pair of electrodes 2 are provided on a peripheral wall of the tank X so as to face with each other. The electrodes 2 are formed of, for example, a non-reactive metal such as platinum and copper. Response current serving as the response signal corresponding to the AC voltage applied to the slurry Xc flows between the pair of electrodes 2. The AC signal applied to the slurry Xc is not limited to the AC voltage, and the AC signal may be AC current.

As shown in FIG. 1, the measurement apparatus main body 3 includes a measurement unit 31 serving as measurement unit, a storage unit 32 serving as storing unit, an operating unit 33, a display unit 34, and a processing unit 35 serving as processing unit.

The measurement unit 31 measures the impedance from the response current that flows when the AC voltage is applied to the slurry Xc located between the pair of electrodes 2. The measurement unit 31 applies the AC voltage to the pair of electrodes 2 in such a manner that the frequency of the AC voltage is changed stepwise. In the above, the AC voltage applied to the pair of electrodes 2 is supplied from a constant-voltage power supply (CV) or a constant-current power supply (CC) that is built into the measurement unit 31. The measurement unit 31 measures the impedance from the response current between the pair of electrodes 2 as a measurement signal every time the frequency of the AC voltage is changed stepwise and outputs it to the processing unit 35.

The storage unit 32 is formed of a RAM and a ROM. A program for executing the uniformity property measurement processing for measuring the uniformity property of the slurry Xc is stored in the storage unit 32. The storage unit 32 is a computer-readable storage medium in which an operation program for the processing unit 35 is recorded. The storage unit 32 may be configured so as to be detachably attachable to the measurement apparatus main body 3.

In addition, in the storage unit 32, the measured value of the impedance corresponding to the AC voltage that is applied to the slurry Xc having known uniformity property such as that described above is stored as a frequency characteristic table by being linked with the corresponding frequency of the AC voltage. In this frequency characteristic table, the frequency characteristics for the real part and the imaginary part of the impedance are associated with each of various slurries Xc.

In addition, in the storage unit 32, various parameters of an equivalent circuit that approximate a complex plane impedance diagram generated from the impedance of the slurry Xc having known uniformity property such as that described above are stored as a uniformity property table by being linked with the above-described uniformity property. In this uniformity property table, the uniformity property including the type of the liquid Xa, the type of the dispersoid Xb, the particle diameter of the dispersoid Xb, the particle diameter distribution of the dispersoid Xb, and so forth is linked for each of the parameters of the equivalent circuits for various slurries Xc.

The operating unit 33 is provided with various operation switches for instructing setting operation of measurement conditions, the start of the uniformity property measurement processing, and so forth. The operating unit 33 outputs operation signals adapted to these operations to the processing unit 35. Instead of the operation switch that is configured mechanically, a touch panel formed in the display unit 34 may be used as the operating unit 33.

The display unit 34 displays various setting screens, measurement results, and so forth for the measurement of the uniformity property in accordance with the instruction from the processing unit 35. In this embodiment, the display unit 34 is formed of a liquid crystal panel, etc.

The processing unit 35 controls respective units forming the uniformity property measurement apparatus 1 in accordance with the operation signal from the operating unit 33. In addition, the processing unit 35 controls the frequency of the AC voltage to be applied to the pair of electrodes 2 and acquires the impedance corresponding to the applied AC voltage, and then, executes the processing of calculating the uniformity property of the slurry Xc on the basis of the acquired impedance.

In this embodiment, the processing unit 35 is formed of a CPU as a computer. The processing unit 35 may also be formed of a plurality of microcomputers.

Next, a functional configuration and operation of the processing unit 35 of the measurement apparatus main body 3 will be described. FIG. 2 is a block diagram showing the functional configuration of the processing unit 35 of the measurement apparatus main body 3.

The processing unit 35 is provided with an analysis setting module 111, an impedance acquisition module 112, a complex plane impedance data generating module 115, an equivalent circuit analysis module 116, and a uniformity property calculation module 117. In the following, the complex plane impedance data generating module 115 is simply referred to as the generating module 115.

The analysis setting module 111 generates a control signal for causing the measurement unit 31 to execute the application of the AC voltage to the electrodes 2 and the measurement of the impedance.

The impedance acquisition module 112 acquires the measured impedance from the measurement unit 31. In addition, the impedance acquisition module 112 has an imaginary number component generating unit 113 and a real number component generating unit 114 respectively generate the imaginary number component of the impedance and the real number component of the impedance from the impedance based on the response current sent from the measurement unit 31.

The imaginary number component generating unit 113 generates the imaginary number component of the acquired impedance and outputs it to the generating module 115, which will be described later. The real number component generating unit 114 generates the real number component of the acquired impedance and outputs it to the generating module 115.

The generating module 115 generates a data indicating the complex plane impedance from the imaginary number part and the real number part of the impedance acquired from the impedance acquisition module 112.

In this embodiment, the generating module 115 generates, as the data indicating the complex plane impedance, the complex plane impedance diagram by setting the imaginary number part of the measured impedance as a vertical-axis and the real number part of the measured impedance as a horizontal axis. The complex plane impedance diagram may be described as a Nyquist diagram.

The generating module 115 outputs the generated complex plane impedance diagram to the equivalent circuit analysis module 116.

The equivalent circuit analysis module 116 executes an equivalent circuit analysis using the equivalent circuit that is formed by combining elements such as a resistor, a capacitor, and so forth.

In this embodiment, a constant phase element (hereinafter referred to as CPE) is applied as the element of the equivalent circuit. In other words, in the equivalent circuit analysis module 116, a parallel circuit (R-CPE) including a resistor R and the CPE is employed as a single element, and the equivalent circuit that is obtained by combining these elements is set.

For example, the equivalent circuit analysis module 116 generates an impedance characteristic data that indicates the frequency characteristics of the real part and the imaginary part of the impedance of the initial equivalent circuit on the basis of parameter of the initial equivalent circuit to which the CPE is applied. The equivalent circuit analysis module 116 sequentially changes the parameter of the equivalent circuit such that thus generated initial impedance characteristic data approaches the measured data for the slurry Xc. The equivalent circuit analysis module 116 outputs, as an analysis result, the parameter of the equivalent circuit that provides the impedance characteristic data that matches with the measured data. As described above, the equivalent circuit analysis module 116 executes the equivalent circuit analysis by using the equivalent circuit to which the CPE is applied.

In this embodiment, the equivalent circuit analysis module 116 generates as the impedance characteristic data the complex plane impedance diagram of the set equivalent circuit.

The constant phase element (the CPE) means the element including a factor that can take various disturbance into account to a normal capacitor C. the impedance ZCPE of the CPE can be expressed by following equation (1):

$$Z_{CPE} = \frac{1}{(j\omega)^p T}, \qquad (1)$$
$$= \frac{1}{\omega^p T}\cos\left(\frac{\pi}{2}p\right) - j\frac{1}{\omega^p T}\sin\left(\frac{\pi}{2}p\right),$$

wherein, in the above equation (1),
j is an imaginary number unit;
$\omega$ is an angular frequency;
T is a CPE constant; and
p is a CPE index (an order of the ZCPE).

As shown in the above equation (1), the impedance ZCPE of the CPE is composed of a CPE constant T and a CPE index p. For example, when the impedance ZCPE indicates a simple capacitive behavior, the CPE index P takes a value within a range from 0 to 1.

In addition, in the above equation (1), when p=1, the CPE constant T becomes equivalent to the normal capacitor C, and the equivalent circuit of the slurry Xc is formed of the normal capacitor C, and therefore, the impedance ZCPE shows the value of the normal capacitor C.

Figure 3A:
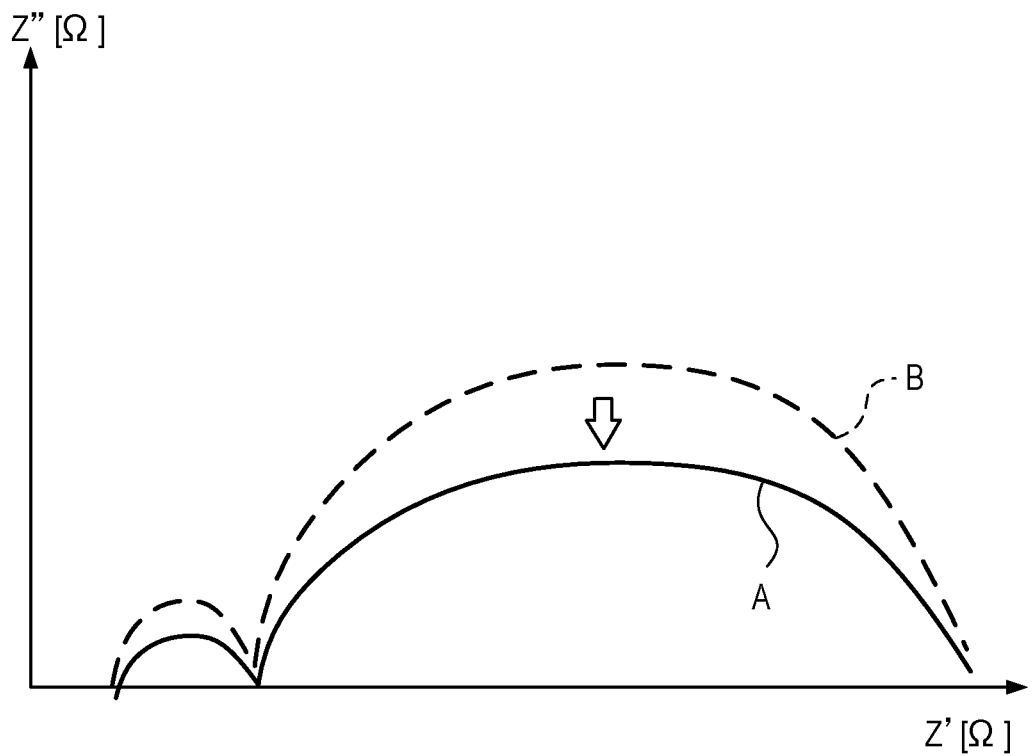
FIG. 3A is a diagram explaining a complex plane impedance diagram generated by a complex plane impedance data generating module and an equivalent circuit analysis module.

FIG. 3a is a diagram explaining the complex plane impedance diagram generated in the generating module 115 and the equivalent circuit analysis module 116. In addition, FIG. 3b is a diagram showing an equivalent circuit CCPE used for the equivalent circuit analysis.

A solid line shown in FIG. 3a is a complex plane impedance diagram A that is generated by the generating module 115 on the basis of the measured data of the impedance. In addition, a broken line is a complex plane impedance diagram B that is generated by the equivalent circuit analysis module 116.

Figure 3B:
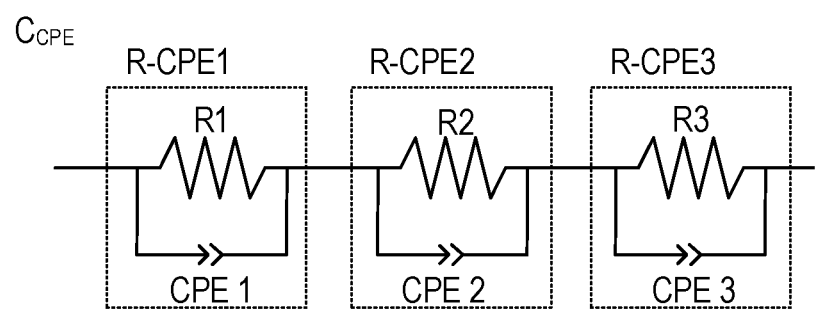
FIG. 3B is a diagram explaining an equivalent circuit used in an equivalent circuit analysis.

The equivalent circuit CCPE shown in FIG. 3b is the equivalent circuit that is obtained by serially connecting a parallel circuit R-CPE1 formed of a resistor R1 and a CPE1, a parallel circuit R-CPE2 formed of a resistor R2 and a CPE2, and a parallel circuit R-CPE3 formed of a resistor R3 and a CPE3.

The complex plane impedance diagram B shown in FIG. 3a is the complex impedance diagram that is obtained by executing the equivalent circuit analysis by using the equivalent circuit CCPE.

The equivalent circuit analysis module 116 repeatedly changes the parameters related to the resistors R and the CPEs in respective parallel circuits of the equivalent circuit CCPE such that the complex plane impedance diagram B is superimposed on the complex plane impedance diagram A that is acquired from the generating module 115.

The uniformity property calculation module 117 acquires and analyses the complex impedance diagram generated by the equivalent circuit analysis module 116.

In this embodiment, the uniformity property calculation module 117 determines that, as the order of the CPE, in other words the CPE index p, approaches unity, the variation of the particle size of the dispersoid Xb contained in the slurry Xc is reduced (in other words, the uniformity of the particle size is increased). In addition, the uniformity property calculation module 117 determines the number of types of the particles of the dispersoid Xb in accordance with the number of the parallel circuit (R-CPE) obtained by the equivalent circuit analysis.

In addition, the uniformity property calculation module 117 calculates the resistance value of the particles of the dispersoid Xb on the basis of the resistance of the resistor R calculated by the equivalent circuit analysis.

In addition, the uniformity property calculation module 117 selects the parameter set by the equivalent circuit analysis module 116 on the basis of the uniformity property table stored in the storage unit 32 and determines the uniformity property that is linked to this parameter as the measured uniformity property of the slurry Xc.

The processing unit 35 having the above-described functional configuration generates the complex plane impedance diagram A from the impedance measured by the measurement unit 31, and generates the complex plane impedance diagram B by using the equivalent circuit, in which the parallel circuit formed of the resistor R and the CPE is employed as the single element, by the equivalent circuit analysis module 116.

In addition, the processing unit 35 sets the parameter of the circuit element of the equivalent circuit such that the complex plane impedance diagram B is superimposed on the complex plane impedance diagram A. Then, the processing unit 35 determines the uniformity property that is linked to the set parameter as the measured uniformity property of the slurry Xc. By doing so, the uniformity property measurement apparatus 1 can calculate the uniformity property of the slurry Xc.

[Uniformity Property Measurement Processing]

Next, the uniformity property measurement processing for determining the uniformity property as the evaluation index of the slurry Xc will be described with reference to FIG. 4.

Figure 4:
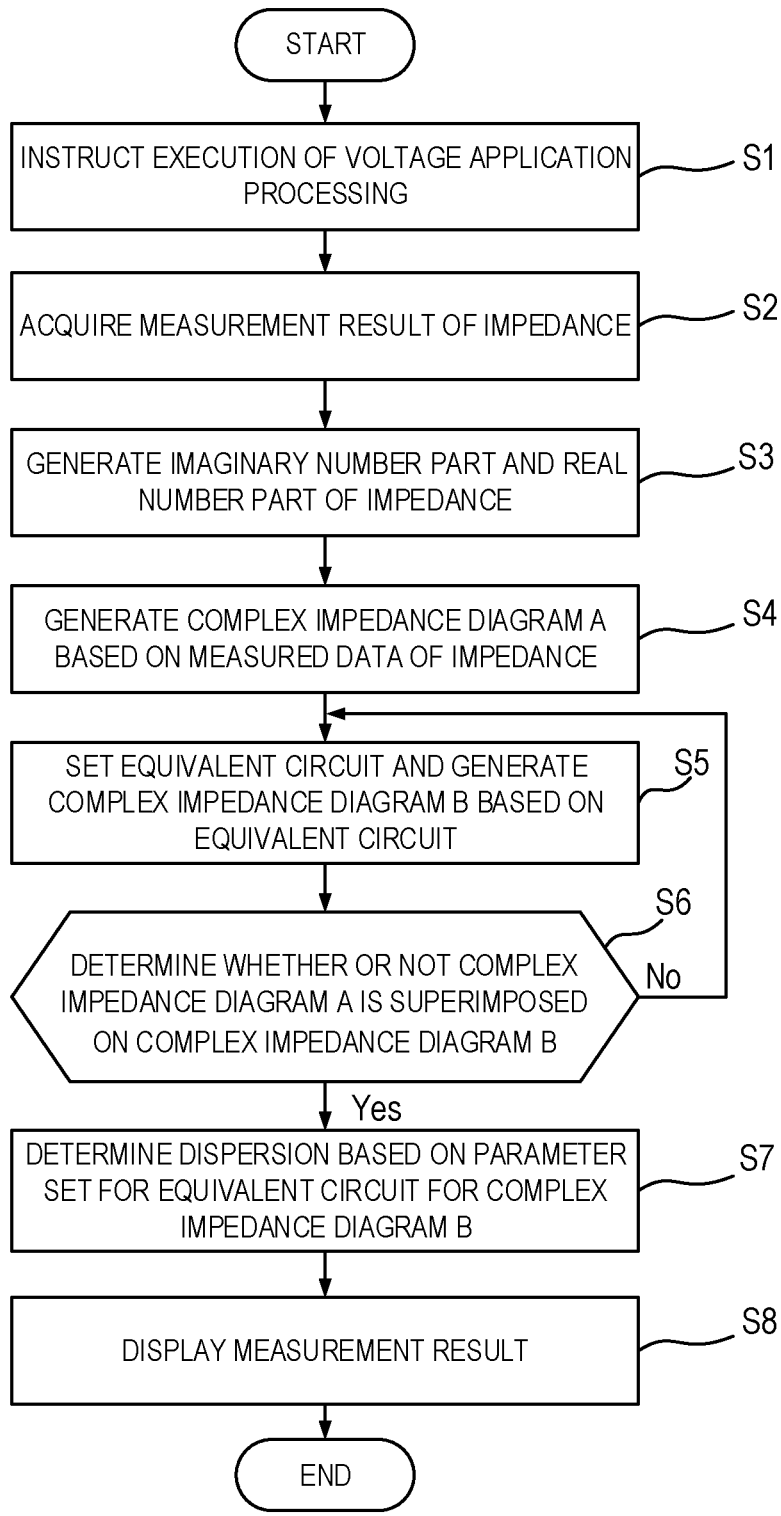
FIG. 4 is a flowchart showing a uniformity property measurement processing executed by the uniformity property measurement apparatus.

FIG. 4 is a flowchart showing the uniformity property measurement processing executed by the uniformity property measurement apparatus 1.

As the uniformity property measurement processing is started by operation on the operating unit 33 by the measurer, the processing proceeds to Step S1.

In Step S1, the analysis setting module 111 of the processing unit 35 instructs the measurement unit 31 to execute voltage application processing to the slurry Xc. Specifically, the analysis setting module 111 instructs the measurement unit 31 to execute the processing in which the AC voltage is applied to the slurry Xc while changing the frequency.

By doing so, in accordance with the instruction from the analysis setting module 111, the measurement unit 31 executes the control in which the AC voltage is applied to the slurry Xc via the pair of electrodes 2 and the frequency of the AC voltage applied is changed.

In addition, every time the frequency of the AC voltage is changed, the measurement unit 31 determines the impedance of the slurry Xc from the response current flowing through the slurry Xc by the pair of electrodes 2. The measurement unit 31 then outputs the measured impedance as the measured data to the impedance acquisition module 112 of the measurement apparatus main body 3.

Next, in Step S2, the impedance acquisition module 112 acquires the measured data of the impedance from the measurement unit 31.

In Step S3, the impedance acquisition module 112 generates the imaginary number component of the impedance by the imaginary number component generating unit 113 and generates the real number component of the impedance by the real number component generating unit 114. The impedance acquisition module 112 outputs the generated imaginary number component and real number component to the generating module 115.

Next, in Step S4, the generating module 115 generates the complex plane impedance diagram A on the basis of the measured data of the impedance as shown in FIG. 3a and outputs the generated complex plane impedance diagram A to the equivalent circuit analysis module 116.

In Step S5, the equivalent circuit analysis module 116 executes, on the basis of the measured data, the analysis on the equivalent circuit, in which the parallel circuit (R-CPE) formed of the resistor R and the CPE is employed as the single element, and sets the parameter of the equivalent circuit that is obtained by combining the elements. Then, the equivalent circuit analysis module 116 generates the complex plane impedance diagram B of the set equivalent circuit.

For example, on the basis of the measured data of the slurry Xc, the equivalent circuit analysis module 116 sets the diameter of a semi-circle drawn on the complex plane as R, the frequency at the apex of the semi-circle as ftop, the initial CPE constant T as expressed in the next equation (2), and the initial CPE index p as unity. The equivalent circuit analysis module 116 then generates the complex plane impedance diagram B of the initial equivalent circuit on the basis of the set values of the CPE constant T and the CPE index P.

$$T = \frac{1}{R \cdot f_{top}} \quad (2)$$

In Step S6, the equivalent circuit analysis module 116 determines whether or not the complex plane impedance diagram A and the complex plane impedance diagram B are superimposed with each other by comparing both diagrams.

When the complex plane impedance diagram A and the complex plane impedance diagram B are not superimposed (Step S6: No), the processing returns to Step S5, and the equivalent circuit analysis module 116 resets the parameter (variable) of the circuit element of the equivalent circuit CCPE and generates a new complex plane impedance diagram B.

The equivalent circuit analysis module 116 repeats the setting of the parameter related to the resistor R and the CPE in each parallel circuit of the equivalent circuit CCPE such that the complex plane impedance diagram B is superimposed on the complex plane impedance diagram A that has been acquired from the generating module 115.

When the complex plane impedance diagram A and the complex plane impedance diagram B are superimposed (Step S6: Yes) in the equivalent circuit analysis module 116, the equivalent circuit analysis module 116 outputs the final complex plane impedance diagram B obtained to the uniformity property calculation module 117.

In Step S7, the uniformity property calculation module 117 acquires the complex plane impedance diagram B from the equivalent circuit analysis module 116. On the basis of the uniformity property table stored in the storage unit 32, the uniformity property calculation module 117 selects the uniformity property that is linked to the parameter of the equivalent circuit CCPE used for the generation of the complex plane impedance diagram B and determines the selected uniformity property as the uniformity property of the slurry Xc, which is the measurement target.

Next, in Step S8, the display unit 34 displays the uniformity property of the slurry Xc, etc. in accordance with the instruction from the processing unit 35. The processing unit 35 then terminates the uniformity property measurement processing.

<Operational Advantages>

Next, operational advantages achieved by this embodiment will be described.

As described above, the uniformity property measurement apparatus 1 according to this embodiment includes: the pair of electrodes 2 configured to apply the AC voltage to the slurry Xc; the measurement unit 31 configured to measure the impedance of the slurry Xc from the response current flowing through the slurry Xc when the AC voltage is applied to the slurry Xc in such a manner that the frequency of the AC voltage is changed stepwise; and the processing unit 35 configured to set the equivalent circuit CCPE, in which the parallel circuit formed of the resistor R and the constant phase element (the CPE) is employed as the element, from the impedance that has been measured in the measurement unit 31, configured to generate the data indicating the complex plane impedance by executing the equivalent circuit analysis by using the set equivalent circuit CCPE, and configured to calculate the uniformity property on the basis of the parameter related to the parallel circuit.

The uniformity property measurement apparatus 1 having the above-described configuration generates the complex plane impedance diagram A from the impedance of the slurry Xc measured from the response current flowing through the slurry Xc and sets the equivalent circuit, in which the parallel circuit formed of the resistor R and the CPE is employed as the element, to generate the complex plane impedance diagram B for this equivalent circuit.

Next, the uniformity property measurement apparatus 1 sets the parameter related to the equivalent circuit such that the complex plane impedance diagram B approximates the complex plane impedance diagram A.

On the basis of the uniformity property table stored in the storage unit 32, the uniformity property measurement apparatus 1 selects the parameter that is obtained from the known slurry and determines the uniformity property linked to the selected parameter as the measured uniformity property of the slurry Xc.

Therefore, compared to the conventional sedimentation test, etc., it is possible to reduce the waiting time required to obtain the measurement result. In addition, it becomes possible to perform the measurement of the evaluation index that does not involve the subjectivity of the measurer.

In addition, the uniformity property measurement apparatus 1 can calculate the uniformity of the particle size of the dispersoid Xb contained in the slurry Xc, the number of types of the particles of the dispersoid Xb, the resistance value of the particles of the dispersoid Xb, and the particle size of the dispersoid Xb by using the uniformity property table stored in the storage unit 32.

[Uniformity Property Determination Program]

The method of acquiring uniformity property described above can also be provided as a program for causing a computer to execute the measurement of the uniformity property.

In other words, the program according to this embodiment is the program configured to cause the computer to execute the determination of the uniformity property of the dispersoid Xb in the slurry Xc that is the mixture in which the insoluble solid matter (the dispersoid Xb) is mixed in the liquid Xa, and is the program configured to cause the computer to execute a processing including: a step of applying the AC voltage to the slurry Xc; a step of measuring the impedance from the response current that flows when the AC voltage is applied to the slurry Xc while changing the frequency of the AC voltage; a step of obtaining, from the measured impedance in accordance with the frequency of the AC voltage, the equivalent circuit, in which the parallel circuit formed of the resistor and the CPE circuit is employed as the element; and a step of calculating the uniformity property by using the equivalent circuit.

In this embodiment, the above-described program may be stored in the storage unit 32, and the above-described program may also be provided by being recorded on a record medium that is detachably attachable to the uniformity property measurement apparatus 1.

Another Embodiment

Although the embodiments of the present invention have been described in the above, the above-mentioned embodiments merely illustrate a part of application examples of the present invention, and the technical scope of the present invention is not intended to be limited to the specific configurations of the above-described embodiments.

In the uniformity property measurement apparatus 1, the storage unit 32, the operating unit 33, and the display unit 34 may be configured separately from the measurement apparatus main body 3. In addition, the measurement unit 31 may be provided as a separate device, for example, as an analyzer by being separated from the uniformity property measurement apparatus 1.

The uniformity property measurement apparatus 1 may take various forms. For example, the uniformity property measurement apparatus 1 may also be configured as that of a stationary type. In addition, the uniformity property measurement apparatus 1 may also be configured as a portable device.

2. Second Embodiment

As the uniformity property acquisition apparatus according to the embodiment of the present invention, a uniformity property evaluation apparatus 201 for evaluating the uniformity property of the mixture will be described. In addition, a uniformity property evaluation processing serving as an example of the method of acquiring the uniformity property according to the embodiment of the present invention will be described.

[Description of Uniformity Property Evaluation Apparatus]

The uniformity property evaluation apparatus 201 according to the embodiment of the present invention will be described in detail with reference to FIGS. 5 and 6.

Figure 5:
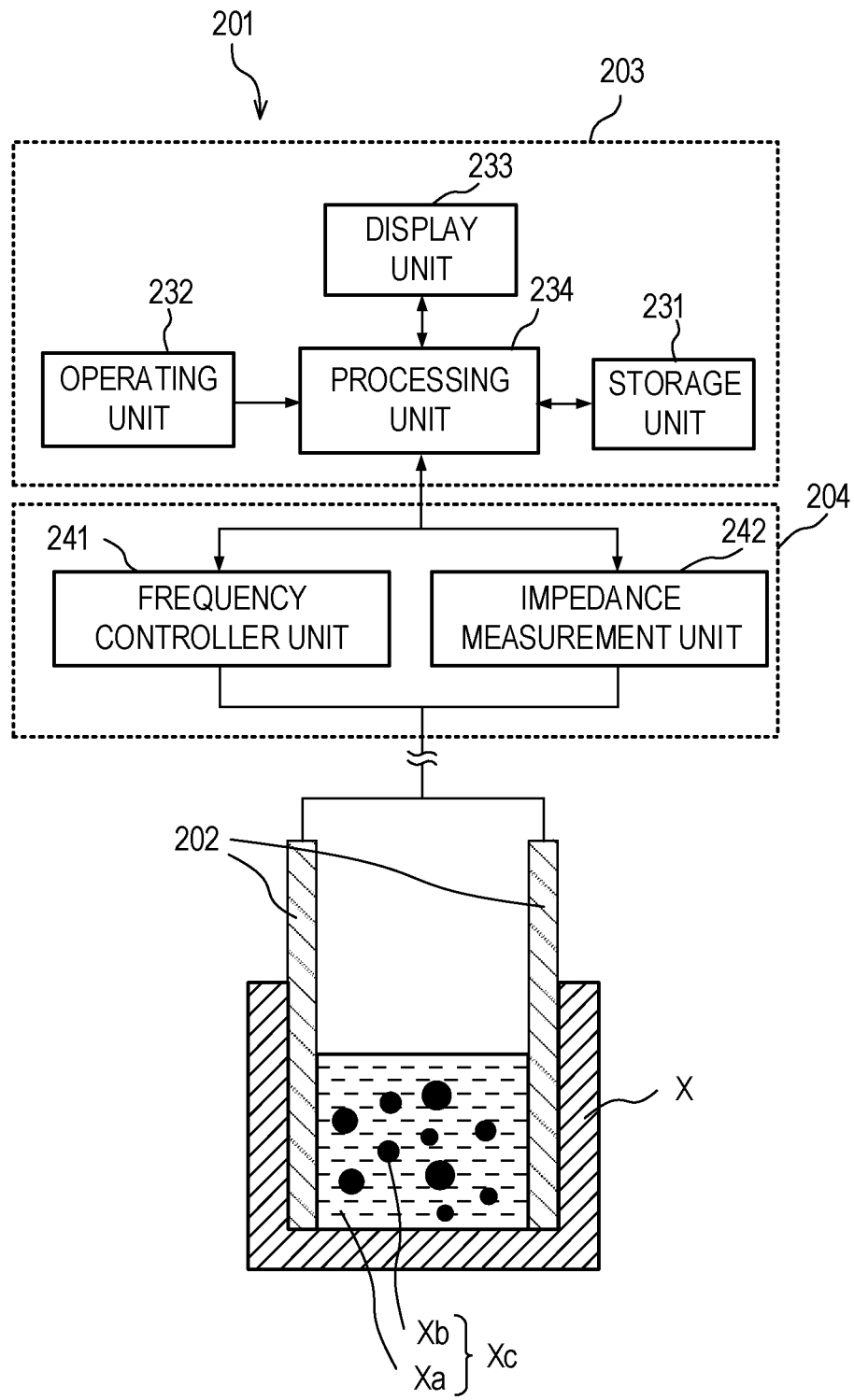
FIG. 5 is a schematic view showing a uniformity property evaluation apparatus according to the embodiment of the present invention.
Figure 6:
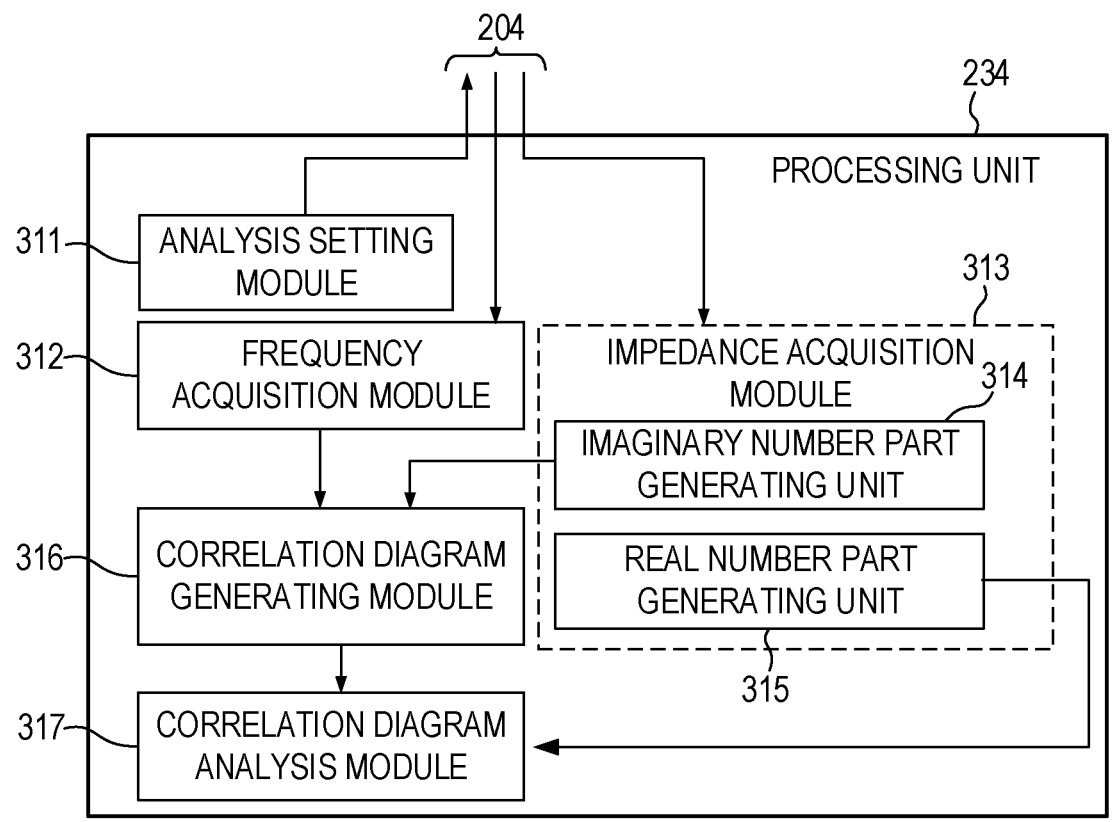
FIG. 6 is a block diagram showing a functional configuration of the processing unit of the measurement apparatus main body.

FIG. 5 is a schematic view showing the uniformity property evaluation apparatus 201 according to this embodiment.

The uniformity property evaluation apparatus 201 is an apparatus for evaluating the slurry Xc that is a type of the mixture that is stored in the tank X and that is formed by mixing the insoluble solid matter (hereinafter referred to as the dispersoid) Xb into the liquid Xa. The uniformity property evaluation apparatus 201 of this embodiment evaluates the uniformity property of the slurry Xc.

In this embodiment, the uniformity property includes the type of the liquid Xa, the type of the dispersoid Xb, the particle diameter of the dispersoid Xb, the particle diameter distribution of the dispersoid Xb, and so forth.

In this embodiment, an example of the slurry Xc includes the mixture in which the electrically conductive particles such as the carbon black, etc. serving as the dispersoid Xb with high electrical conductivity is dispersed in the solvent (the organic solvent containing the binder resin and the active material) serving as the liquid Xa with low electrical conductivity.

The uniformity property evaluation apparatus 201 includes a pair of electrodes 202, a measurement apparatus main body 203, and an analyzer 204.

The pair of electrodes 202 apply the AC voltage as the AC signal to the slurry Xc stored in the tank X. The pair of electrodes 202 are provided on the peripheral wall of the tank X so as to face with each other. The electrodes 202 are formed of, for example, the non-reactive metal such as platinum and copper. The response current as the response signal corresponding to the AC voltage applied to the slurry Xc flows between the pair of electrodes 202. The AC signal applied to the slurry Xc is not limited to the AC voltage, and the AC signal may be AC current.

As shown in FIG. 5, the measurement apparatus main body 203 includes a storage unit 231 serving as the storing unit, an operating unit 232, a display unit 233, and a processing unit 234 serving as the processing unit.

The storage unit 231 is formed of the RAM and the ROM. A program for executing the uniformity property evaluation processing for calculating the uniformity property of the particles contained in the slurry Xc is stored in the storage unit 231. The storage unit 231 is the computer-readable storage medium in which the operation program for the processing unit 234 is recorded. The storage unit 231 may be configured so as to be detachably attachable to the measurement apparatus main body 203.

In addition, in the storage unit 231, the measured values of the impedance corresponding to the AC voltage applied to various reference slurries are stored as a table by being linked with the frequency of the AC voltage. The reference slurry refers to the slurry that is prepared in advance by a reference production method. As the reference slurry, it is desirable that the slurry Xc the above-described uniformity property evaluation index of which is known be used.

In the table stored in the storage unit 231, the uniformity property evaluation index acquired in advance by another method and the impedance characteristic data indicating the frequency characteristic of the measured value of the impedance are linked with each other for the various reference slurries.

In addition, correlation information indicating the correlation between the frequency of the applied AC voltage and the imaginary number component of the impedance measured from the response current corresponding to the applied AC voltage is stored in the storage unit 231 for the various reference slurries. For the correlation information, the uniformity property evaluation index that has been acquired by another method in advance and the correlation information set on the basis of the impedance characteristic data are linked to each other for the various reference slurries. As described above, the uniformity property evaluation index that is stored in the storage unit 231 is the evaluation index that has been set in advance on the basis of experimental data, simulation result, or the like.

The correlation information described above includes, for example, imaginary number characteristic data indicating a frequency characteristic of the imaginary number component of the impedance, the component value and the frequency at which the imaginary number component is maximum, the frequency range in which the imaginary number component exceeds a specific value, the component value and the frequency at which the rate of change of the imaginary number component is maximum, or the like.

In this embodiment, the imaginary number characteristic data of the impedance is used as the correlation information of the reference slurry, and from this imaginary number characteristic data, a correlation diagram indicating the correlation between the frequency of the AC voltage and the imaginary number component of the impedance is generated. The correlation diagram is a diagram in which, for example, the imaginary number characteristic data of the reference slurry is plotted on biaxial Cartesian coordinates for the frequency of the AC voltage and the imaginary number component of the impedance. In the following, the correlation diagram based on the correlation information for the reference slurry will be referred to as "the reference correlation diagram".

The operating unit 232 is provided with various operation switches for instructing the setting operation of the measurement conditions, start of the uniformity property evaluation processing, and so forth. The operating unit 232 outputs the operation signal corresponding to these operations to the processing unit 234. Instead of using the mechanically configured operation switch, the touch panel provided in the display unit 233 may be used as the operating unit 232.

The display unit 233 displays various setting screens, measurement results, and so forth for the evaluation of the uniformity property in accordance with the instruction from the processing unit 234. In this embodiment, the display unit 233 is formed of a liquid crystal panel, etc.

The processing unit 234 instructs a frequency controller unit 241 of the analyzer 204 to change the frequency of the AC voltage. In addition, the processing unit 234 receives the measured impedance at the analyzer 204 and executes processing of calculating the uniformity property evaluation index of the slurry Xc, which is the measurement target, on the basis of thus received impedance.

In this embodiment, the processing unit 234 is formed of a CPU as a computer. The processing unit 234 may also be formed of a plurality of microcomputers.

The analyzer 204 is provided with the frequency controller unit 241 serving as a frequency control unit and an impedance measurement unit 242 serving as impedance measurement unit.

The frequency controller unit 241 controls the frequency of the AC voltage to be applied to the slurry Xc via the electrodes 202 in accordance with the control signal from the measurement apparatus main body 203. The AC voltage whose frequency is changed stepwise by the frequency controller unit 241 is applied between the pair of electrodes 202. In the above, the AC voltage applied to the pair of electrodes 202 is supplied from the constant-voltage power supply (CV) or the constant-current power supply (CC) that is built into the frequency controller unit 241.

The impedance measurement unit 242 measures the impedance from the response current flowing through the slurry Xc in accordance with the AC voltage with different frequencies that is applied by the frequency controller unit 241 to the slurry Xc from between the pair of electrodes 202.

The impedance measurement unit 242 measures the impedance from the response current flowing between the pair of electrodes 202 every time the frequency of the AC voltage is changed by the frequency controller unit 241. The impedance measurement unit 242 then outputs the measurement result of the impedance to the processing unit 234.

Next, the functional configuration and the operation of the processing unit 234 of the measurement apparatus main body 203 will be described. FIG. 6 is a block diagram showing the functional configuration of the processing unit 234 of the measurement apparatus main body 203.

The processing unit 234 controls respective units forming the uniformity property evaluation apparatus 201 in accordance with the operation signal from the operating unit 232. In addition, the processing unit 234 executes the processing of calculating the uniformity property evaluation index of the slurry Xc on the basis of the measurement result of the impedance.

The processing unit 234 is provided with an analysis setting module 311, a frequency acquisition module 312, an impedance acquisition module 313, a correlation diagram generating module 316, and a correlation diagram analysis module 317.

The analysis setting module 311 generates the control signal for controlling the analyzer 204 and outputs it to the frequency controller unit 241.

The frequency acquisition module 312 acquires the frequency of the AC voltage set by the frequency controller unit 241 and outputs it to the correlation diagram generating module 316, which will be described below. The impedance acquisition module 313 acquires the impedance on the basis of the response current that is detected for every frequency set by the analyzer 204.

The impedance acquisition module 313 has an imaginary number component generating unit 314 that generates the imaginary number component of the impedance from the impedance sent from the analyzer 204 and a real number component generating unit 315 that generates the real number component of the impedance. The imaginary number component generating unit 314 generates the imaginary number component of the acquired impedance and outputs it to the correlation diagram generating module 316, which will be described below. The real number component generating unit 315 generates the real number component of the acquired impedance and outputs it to the correlation diagram analysis module 317.

The correlation diagram generating module 316 acquires the frequency of the AC voltage set by the analyzer 204. In addition, the correlation diagram generating module 316 receives the imaginary number component of the impedance that is generated by the imaginary number component generating unit 314 for every frequency of the AC voltage set by the analyzer 204.

The correlation diagram generating module 316 then generates the correlation information that indicates the correlation between the received frequency and the imaginary number component of the impedance. As described above, the correlation diagram generating module 316 generates the correlation information for the slurry Xc that is the measurement target. As the correlation information, for example, the imaginary number characteristic data of the impedance, the component value and the frequency at which the imaginary number component is maximum, the frequency range in which the imaginary number component exceeds a specific value, the component value and the frequency at which the rate of change of the imaginary number component is maximum, or the like is used.

In this embodiment, the correlation diagram generating module 316 generates the correlation diagram indicating the correlation between the received frequency and the imaginary number component of the impedance and outputs the generated correlation diagram to the correlation diagram analysis module 317.

In addition, the correlation diagram generating module 316 acquires the correlation information of the reference slurry from the frequency acquisition module 312 and the storage unit 231, generates the above-described reference correlation diagram on the basis of the acquired correlation information, and outputs the generated reference correlation diagram to the correlation diagram analysis module 317.

Figure 7:
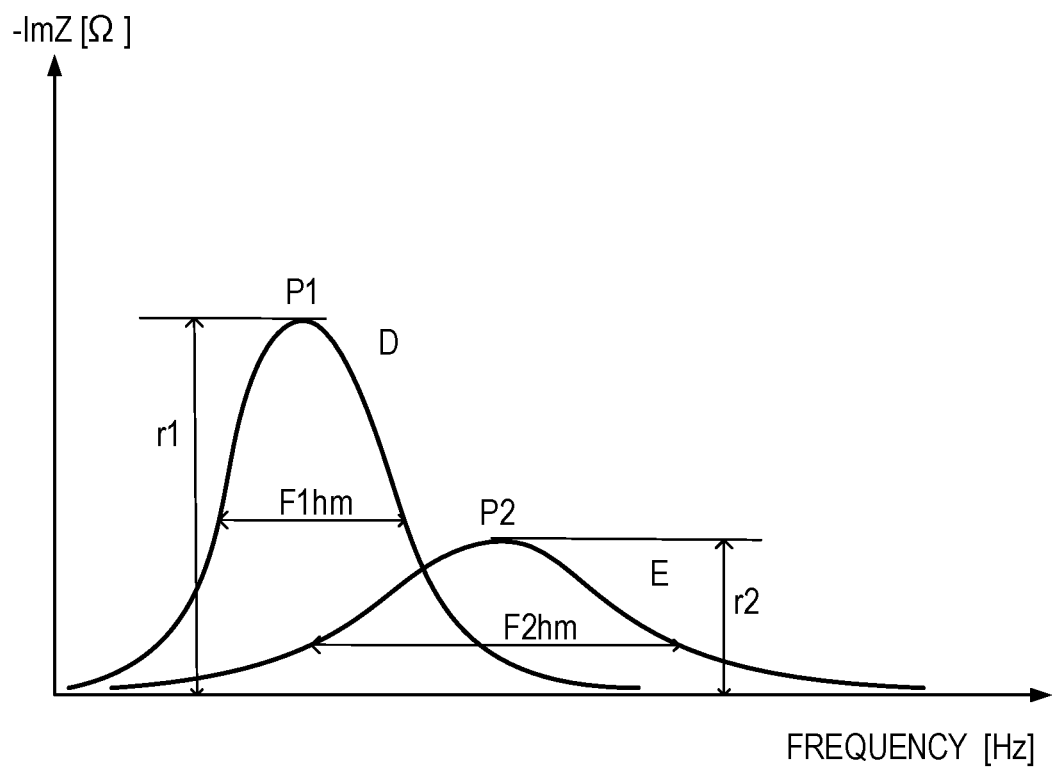
FIG. 7 is a diagram showing a correlation diagram generated by the processing unit between frequency of AC voltage applied to a slurry and imaginary number component of the measured impedance.

FIG. 7 is a diagram showing the correlation diagram generated by the correlation diagram generating module 316 between the frequency of the AC voltage and the imaginary number component of the impedance.

FIG. 7 shows two correlation diagram D and correlation diagram E generated by the correlation diagram generating module 316 on the basis of the measurement result of the impedance of the slurry Xc.

In FIG. 7, the correlation diagram D has a sharp peak P1. The peak P1 has a height r1, and its half-width is shown by F1$hm$. In addition, the correlation diagram E has a broad peak P2. The peak P2 has a height r2, and its half-width is shown by F2$hm$.

The correlation diagram analysis module 317 receives and analyzes the correlation diagrams D and E generated by the correlation diagram generating module 316.

In this embodiment, the correlation diagram analysis module 317 determines that the smaller the half-width value of the peak in the correlation diagram is, the higher the uniformity of the particle size of the dispersoid Xb contained in the slurry Xc becomes. The uniformity in this context refers to an index indicating a degree of uniformness of the particle size of the dispersoid Xb. As the particle size of the dispersoid Xb approaches the uniform state, the uniformity is increased, and as the particle size of the dispersoid Xb approaches the non-uniform state, the uniformity is decreased.

In this embodiment, the phrase "the uniformity of the particle size is high" means that the variation of the particle size of the dispersoid Xb is small. In other words, it means that the smaller the half-width value of the peak is, the more uniform the particle diameter of the dispersoid Xb is.

In this embodiment, by setting a specific threshold value for the half-width, the uniformity of the particle size can be expressed with relative evaluation such as "high", "low", or the like.

Furthermore, the correlation diagram analysis module 317 determines the number of types of the dispersoid Xb in accordance with the number of peaks in the correlation diagram. The number of peaks in the correlation diagram obtained indicates the number of types of the dispersoid Xb.

The correlation diagram analysis module 317 detects the number of peaks in the correlation diagram and determines the number of types of the dispersoid Xb contained in the slurry Xc. According to the correlation diagrams D and E shown in FIG. 7, it is possible to determine that the number of types of the dispersoid Xb contained in the slurry Xc is two.

The processing unit 234 having the above-described functional configuration acquires the frequency of the AC voltage that is set by the frequency controller unit 241 of the analyzer 204 and the impedance based on the response current that is detected for every frequency set by the analyzer 204. The processing unit 234 then generates the correlation diagram for the imaginary number component of the impedance thus acquired and the frequency.

The processing unit 234 then determines the uniformity of the particle size of the dispersoid Xb in the slurry Xc from the half-width value of the peak in the generated correlation diagram.

In addition, the processing unit 234 determines the number of types of the dispersoid Xb in accordance with the number of peaks in the correlation diagram.

The processing unit 234 selects, among the table stored in the storage unit 231, the correlation diagram that is similar to the generated correlation diagram. The processing unit 234 then determines the uniformity property linked to the correlation diagram in the table as the measured uniformity property of the slurry Xc.

[Uniformity Property Evaluation Processing]

Next, the uniformity property evaluation processing for determining the uniformity property of the slurry Xc will be described with reference to FIG. 8.

Figure 8:
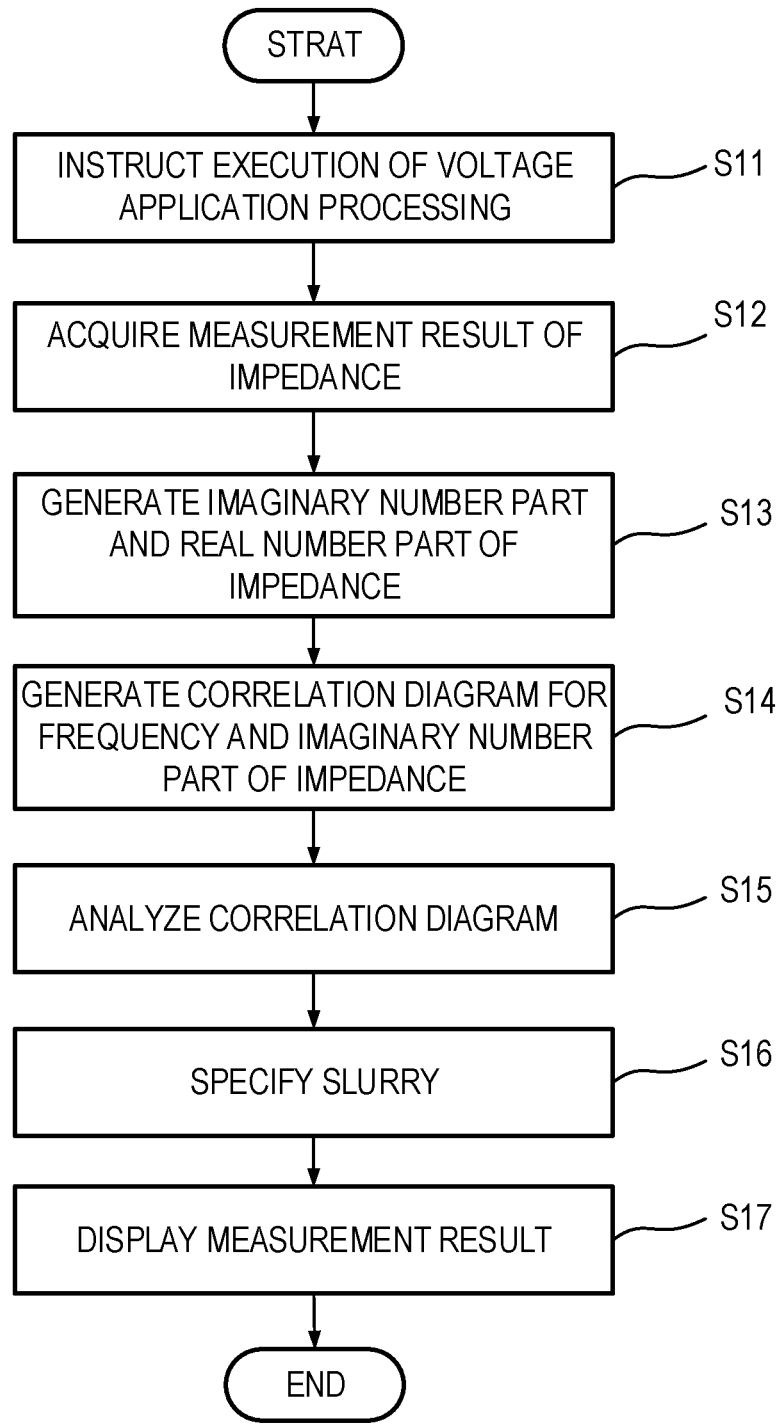
FIG. 8 is a flowchart showing a uniformity property evaluation processing executed by the uniformity property evaluation apparatus.

FIG. 8 is a flowchart showing the uniformity property evaluation processing executed by the uniformity property evaluation apparatus 201.

First, when the uniformity property evaluation processing is started by operation of the operating unit 232 by measurer, the processing proceeds to Step S11 by the processing unit 234.

In Step S11, the analysis setting module 311 of the processing unit 234 instructs the analyzer 204 to execute the voltage application processing to the slurry Xc. Specifically, the analysis setting module 311 instructs the analyzer 204 to execute the processing in which the AC voltage is applied to the slurry Xc while changing the frequency.

By doing so, in the analyzer 204, the frequency controller unit 241 applies the AC voltage to the slurry Xc via the pair of electrodes 202 in accordance with the instruction from the analysis setting module 311 and executes the control in which the frequency of the AC voltage applied is changed.

Every time the frequency of the AC voltage is changed by the frequency controller unit 241, the impedance measurement unit 242 determines the impedance of the slurry Xc from the response current flowing through the slurry Xc by the pair of electrodes 202. The impedance measurement unit 242 then calculates the impedance from the set frequency of the AC voltage and the response current flowing through the slurry Xc caused by the AC voltage at that frequency and output the calculated result to the measurement apparatus main body 203 as the measurement result.

Next, in Step S12, the frequency acquisition module 312 of the processing unit 234 receives the frequency of the AC voltage that is set by the frequency controller unit 241 from the impedance measurement unit 242. In addition, in the processing unit 234, the impedance acquisition module 313 acquires the measured data of the impedance that is output from the impedance measurement unit 242.

Next, in Step S13, in the impedance acquisition module 313, the imaginary number component generating unit 314 generates the imaginary number component of the impedance.

In Step S14, the correlation diagram generating module 316 of the processing unit 234 generates the correlation diagram for the frequency of the AC voltage acquired from the frequency acquisition module 312 and the imaginary number component of the impedance acquired from the imaginary number component generating unit 314. In the above, the correlation diagram shows the frequency characteristic of the AC voltage for the imaginary number component of the impedance.

The correlation diagram generating module 316 outputs the generated correlation diagrams D and E to the correlation diagram analysis module 317.

In Step S15, the correlation diagram analysis module 317 acquires the correlation diagrams D and E from the correlation diagram generating module 316 and analyzes them.

In this embodiment, the correlation diagram analysis module 317 detects the size of the peaks and the number of peaks in the obtained correlation diagrams D and E and calculates the half-widths of the peaks.

In Step S16, the correlation diagram analysis module 317 evaluates the measured uniformity property of the slurry Xc.

In this embodiment, for the correlation diagrams D and E, the correlation diagram analysis module 317 determines that the smaller the half-width value of the peak is, the higher the uniformity of the size of the dispersoid Xb (particles) contained in the slurry Xc is. Furthermore, the correlation diagram analysis module 317 specifies the type of the dispersoid Xb contained in the slurry Xc on the basis of the number of peaks, in other words, the number of maxima in the respective correlation diagrams D and E.

As described above, the correlation diagram analysis module 317 calculates the uniformity property evaluation index of the uniformity of the particle size, the types of the particles contained in the slurry Xc, and so forth. In other words, for the slurry Xc that is the measurement target, the correlation diagram analysis module 317 evaluates the uniformity property of the slurry Xc on the basis of the correlation information that shows the relationship between the frequency of the AC voltage and the measured value of the imaginary number component of the impedance.

Instead, the processing unit 234 may generate a plurality of reference correlation diagrams from the correlation information stored in the storage unit 231 and select among the generated reference correlation diagrams the correlation diagram that is similar to the correlation diagram that has been generated on the basis of the measurement result. Then, the processing unit 234 may specify the uniformity of the particle size in the slurry Xc, the types of the particles in the slurry Xc, and so forth that are linked to the selected reference correlation diagram.

Next, in Step S17, the display unit 233 displays an evaluation result, etc. in accordance with the instruction from the processing unit 234. The processing unit 234 then terminates the uniformity property evaluation processing.

<Operational Advantages>

Next, operational advantages achieved by this embodiment will be described.

As described above, the uniformity property evaluation apparatus 201 according to this embodiment evaluates the uniformity property of the slurry Xc on the basis of the impedance of the slurry Xc measured from the response current flowing through the slurry Xc when the AC voltage is applied to the slurry Xc, in which the dispersoid Xb that is insoluble in the liquid Xa is mixed, while changing the frequency.

According to this embodiment, the processing unit 234 of the uniformity property evaluation apparatus 201 generates the correlation information that indicates the correlation between the imaginary number component of the impedance measured by the analyzer 204 in accordance with the frequency of the AC voltage when the frequency of the AC voltage is changed and the frequency of the applied AC voltage. The processing unit 234 then evaluates the uniformity property of the slurry Xc on the basis of the generated correlation information.

More specifically, the processing unit 234 calculates the uniformity property of the slurry Xc in accordance with the half-widths of the peaks in the correlation diagrams D and E that are generated on the basis of the correlation information for the slurry Xc. Specifically, the processing unit 234 determines that the smaller the half-widths of the peaks in the correlation diagrams D and E are, the higher the uniformity of the size of the dispersoid Xb is.

Furthermore, the correlation diagram analysis module 317 specifies the type of the dispersoid Xb contained in the slurry Xc on the basis of the number of peaks in the respective correlation diagrams D and E.

As described above, the processing unit 234 can calculates the uniformity property of the slurry Xc.

Therefore, compared to the conventional sedimentation test, etc., it is possible to reduce the waiting time required to obtain the measurement result. In addition, it becomes possible to perform the measurement of the uniformity property evaluation index that does not involve the subjectivity of the measurer.

In addition, according to this embodiment, the uniformity property evaluation apparatus 201 is further provided with the storage unit 231 that stores: for each of a plurality of reference liquids (the reference slurry) that are the references of the slurry Xc, the correlation information that indicates the correlation between the imaginary number component of the impedance of the reference liquid and the frequency of the AC voltage; and a predetermined uniformity property evaluation index. The processing unit 234 then selects, among the plurality of correlation information stored in the storage unit 231, the correlation information that corresponds to the correlation information generated on the basis of the measured value of the impedance and calculates the uniformity property evaluation index that is linked to the selected correlation information. By doing so, it is possible to evaluate the uniformity property of the slurry Xc on the basis of the correlation information generated from the measured value of the impedance.

[Uniformity Property Evaluation Program]

The above-described method of evaluating the uniformity property can also be provided as the program for causing the computer to execute the measurement of the uniformity property evaluation index.

In other words, the program according to this embodiment is the program that causes the computer to execute the evaluation of the slurry Xc serving as the mixture in which the insoluble solid matter (the dispersoid Xb) is mixed in the liquid Xa, and is the program that causes the computer to execute the processing that includes: a step of applying the AC voltage to the slurry Xc; a step of measuring the impedance from the response current that flows when the AC voltage is applied to the slurry Xc while changing the frequency of the AC voltage; and a step of evaluating the uniformity property of the slurry Xc on the basis of the impedance measured in accordance with the frequency of the AC voltage and the frequency of the AC voltage applied.

In this embodiment, the above-described program may be stored in the storage unit 231, and the program may also be provided by being recorded in a record medium that is detachably attachable to the uniformity property evaluation apparatus 201.

Other Embodiments

Although the embodiments of the present invention have been described in the above, the above-mentioned embodiments merely illustrate a part of application examples of the present invention, and the technical scope of the present invention is not intended to be limited to the specific configurations of the above-described embodiments.

In the uniformity property evaluation apparatus 201, the storage unit 231, the operating unit 232, and the display unit 233 may also be configured separately from the measurement apparatus main body 203. In addition, the analyzer 204 may also be integrated into the uniformity property evaluation apparatus 201 as the functional configuration of the uniformity property evaluation apparatus 201.

The uniformity property evaluation apparatus 201 may take various forms. For example, both of the uniformity property evaluation apparatus 201 and the analyzer 204 may also be configured as that of the stationary type. In addition, the uniformity property evaluation apparatus 201 and the analyzer 204 may also be configured as the portable device having the functions thereof.

The present application claims a priority based on Japanese Patent Application 2020-009423 filed with the Japan Patent Office on Jan. 23, 2020 and Japanese Patent Application 2020-009424 filed with the Japan Patent Office on Jan. 23, 2020, the entire contents of which are incorporated into this specification by reference.

EXPLANATION OF REFERENCE

1 uniformity property measurement apparatus
2 electrode
3 measurement apparatus main body
31 measurement unit
32 storage unit
33 operating unit
34 display unit
35 processing unit
111 analysis setting module
112 impedance acquisition module
113 imaginary number component generating unit
114 real number component generating unit
115 complex plane impedance data generating module, generating module
116 equivalent circuit analysis module
117 uniformity property calculation module
201 uniformity property evaluation apparatus
202 electrode
203 measurement apparatus main body
204 analyzer 231 storage unit
232 operating unit
233 display unit
234 processing unit
241 frequency controller unit
242 impedance measurement unit
311 analysis setting module
312 frequency acquisition module
313 impedance acquisition module
314 imaginary number component generating unit
316 correlation diagram generating module
317 correlation diagram analysis module

What is claimed is:

1. A uniformity property acquisition apparatus configured to determine a uniformity property of a mixture in which an insoluble solid matter is mixed in liquid, the uniformity property acquisition apparatus comprising:
a pair of electrodes configured to apply an AC signal to the mixture;
a measurement unit configured to measure impedance of the mixture based on a response signal flowing through the mixture when the AC signal is applied to the mixture; and
a processing unit configured to
acquire the uniformity property of the mixture based on the impedance measured by the measurement unit,
set an equivalent circuit, in which a parallel circuit formed of a resistor and a constant phase element is employed as an element, from the impedance measured in the measurement unit,
generate data indicating complex plane impedance by executing an equivalent circuit analysis using the equivalent circuit, and
calculate the uniformity property based on a parameter related to the parallel circuit.

2. The uniformity property acquisition apparatus according to claim 1, wherein
the processing unit is configured to determine a number of types of the solid matter in accordance with a number of the parallel circuit obtained by the equivalent circuit analysis.

3. The uniformity property acquisition apparatus according to claim 1, wherein
the processing unit is configured to determine that, as an order of the constant phase element approaches unity, a uniformity of size of the solid matter is increased.

4. A uniformity property acquisition apparatus configured to determine a uniformity property of a mixture in which an insoluble solid matter is mixed in liquid, the uniformity property acquisition apparatus comprising:
a pair of electrodes configured to apply an AC signal to the mixture;
a measurement unit configured to measure impedance of the mixture based on a response signal flowing through the mixture when the AC signal is applied to the mixture;
a processing unit configured to acquire the uniformity property of the mixture based on the impedance measured by the measurement unit;
a frequency control unit configured to control a frequency of the AC signal; and
a storing unit configured to store, for each respective reference liquid of a plurality of reference liquids providing references for the mixture, correlation information indicating a correlation between an imaginary number component of impedance of the respective reference liquid and the frequency of the AC signal, and an evaluation index for evaluating the uniformity property,
wherein
the processing unit is configured to evaluate the uniformity property based on the impedance measured by the measurement unit for every frequency, and
the processing unit selects, from the storing unit, correlation information from the stored correlation information that corresponds to correlation information generated based on the impedance measured by the measurement unit, and calculates the evaluation index linked to the selected correlation information.

5. The uniformity property acquisition apparatus according to claim 4, wherein the processing unit is configured to:
generate, when the frequency of the AC signal is changed, generated correlation information indicating a correlation between an imaginary number component of the impedance measured by the measurement unit in accordance with the frequency and the frequency of the AC signal applied, and
evaluate the uniformity property based on the generated correlation information.

6. The uniformity property acquisition apparatus according to claim 5, wherein the processing unit is configured to determine the number of types of the solid matter in accordance with a number of peaks of the imaginary number component specified by the generated correlation information.

7. The uniformity property acquisition apparatus according to claim 5, wherein the processing unit is configured to determine that, based on the generated correlation information, the smaller a half-width value of a peak in a correlation diagram indicating the correlation of the generated correlation information is, the higher the uniformity property of size of the solid matter becomes.

8. A method for determining a uniformity property of a mixture in which an insoluble solid matter is mixed in liquid, the method comprising:
applying an AC signal to the mixture;
measuring impedance of the mixture based on a response signal flowing through the mixture when the AC signal is applied to the mixture,
wherein the measuring includes measuring the impedance of the mixture based on the response signal flowing through the mixture when the AC signal is applied to the mixture while changing a frequency of the AC signal; and
acquiring the uniformity property of the mixture based on the measured impedance, wherein the acquiring the uniformity property includes evaluating the uniformity property based on the measured impedance and the frequency of the AC signal applied to the mixture.

9. A non-transitory computer-readable recording medium including a program configured to cause a computer to determine a uniformity property of a mixture in which an insoluble solid matter is mixed in liquid, the program causing the computer to:
apply an AC signal to the mixture;
measure impedance of the mixture based on a response signal flowing through the mixture when the AC signal is applied to the mixture, wherein to measure the impedance, the computer is to measure the impedance of the mixture based on the response signal flowing through the mixture when the AC signal is applied to the mixture while changing a frequency of the AC signal; and acquire the uniformity property of the mixture based on the measured impedance, wherein to acquire the uniformity property, the computer is to evaluate the uniformity property based on the impedance measured in accordance with the frequency and the frequency of the AC signal applied to the mixture.

10. A method for determining a uniformity property of a mixture in which an insoluble solid matter is mixed in liquid, the method comprising:

applying AC signal to the mixture while changing a frequency of the AC signal;

measuring impedance of the mixture based on a response signal flowing through the mixture when the AC signal is applied to the mixture, wherein the measuring includes measuring the impedance of the mixture from the response signal flowing through the mixture when the AC signal is applied to the mixture; and acquiring the uniformity property of the mixture based on the measured impedance, wherein the acquiring the uniformity property includes calculating the uniformity property by obtaining from the measured impedance an equivalent circuit, in which a parallel circuit formed of a resistor and a constant phase element is employed as an element, and by using the equivalent circuit.

11. A non-transitory computer-readable recording medium including a program configured to cause a computer to determine a uniformity property of a mixture in which an insoluble solid matter is mixed in liquid, the program causing the computer to:

apply an AC signal to the mixture while changing a frequency of the AC signal;

measure impedance of the mixture based on a response signal flowing through the mixture when the AC signal is applied to the mixture, wherein to measure the impedance, the computer is to measure the impedance of the mixture from the response signal flowing through the mixture when the AC signal is applied to the mixture; and acquire the uniformity property of the mixture based on the measured impedance, wherein to acquire the uniformity property, the computer is to calculate the uniformity property from the measured impedance by obtaining an equivalent circuit, in which a parallel circuit formed of a resistor and a constant phase element is employed as an element, and by using the equivalent circuit.

\* \* \* \* \*